United States Patent
Veil et al.

(10) Patent No.: US 9,899,175 B2
(45) Date of Patent: Feb. 20, 2018

(54) SAFETY SWITCHING DEVICE WITH FAILSAFE INPUTS

(71) Applicant: PILZ GMBH & CO. KG, Ostfildern (DE)

(72) Inventors: Richard Veil, Ostfildern (DE); Dietmar Seizinger, Ostfildern (DE); Marco Kluge, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 115 days.

(21) Appl. No.: 14/757,405

(22) Filed: Dec. 23, 2015

(65) Prior Publication Data

US 2016/0118212 A1    Apr. 28, 2016

Related U.S. Application Data

(63) Continuation of application No. PCT/EP2014/063036, filed on Jun. 20, 2014.

(30) Foreign Application Priority Data

Jun. 27, 2013 (DE) .......................... 10 2013 106 739

(51) Int. Cl.
*H01H 71/10* (2006.01)
*G05B 9/03* (2006.01)
(Continued)

(52) U.S. Cl.
CPC ............... *H01H 71/10* (2013.01); *G05B 9/03* (2013.01); *G05B 19/058* (2013.01);
(Continued)

(58) Field of Classification Search
CPC ........ H01H 71/10; G05B 9/03; G05B 19/058; G05B 2219/14048; G05B 2219/14054; H03K 19/007
(Continued)

(56) References Cited

U.S. PATENT DOCUMENTS 7,593,205 B2   9/2009  Veil
7,672,109 B2 * 3/2010  Nitsche ............... H01H 47/002
                                               361/115
(Continued)

FOREIGN PATENT DOCUMENTS

CN    1784640 A    6/2006
CN    1831683 A    9/2006
(Continued)

OTHER PUBLICATIONS

English language translation of International Preliminary Report on Patentability (Chapter I) for PCT/EP2014/063036; 18 pp.
(Continued)

*Primary Examiner* — Brandon S Cole
(74) *Attorney, Agent, or Firm* — Harness, Dickey & Pierce, P.L.C.

(57) ABSTRACT

A fail-safe safety switching device comprises first and second input channels for receiving first and second input signals, and a first testing arrangement for testing the first and second input channels. The first input channel comprises a first entry circuit and a first threshold element connected via a first coupling element to a second testing arrangement and a first transition circuit in a galvanically isolated manner. The second input channel comprises a second entry circuit and a second threshold element connected via a second coupling element to a third testing arrangement and a second transition circuit in a galvanically isolated manner. The first testing arrangement comprises a third coupling element, a ground terminal and a group testing terminal. The first and second threshold elements are connected to the ground terminal and via the third coupling element to the group testing terminal in a galvanically isolated manner.

18 Claims, 5 Drawing Sheets

(51) Int. Cl.
*H03K 19/007* (2006.01)
*G05B 19/05* (2006.01)

(52) U.S. Cl.
CPC . *H03K 19/007* (2013.01); *G05B 2219/14048* (2013.01); *G05B 2219/14054* (2013.01)

(58) Field of Classification Search
USPC .................................................. 307/326–328
See application file for complete search history.

(56) References Cited

U.S. PATENT DOCUMENTS

| | | | |
|---|---|---|---|
| 7,715,932 B2 | 5/2010 | Seizinger | |
| 7,719,255 B2 | 5/2010 | Oster | |
| 7,764,620 B2 | 7/2010 | Brousek | |
| 7,898,118 B2* | 3/2011 | Nitsche | H01H 47/005 307/326 |
| 8,814,233 B2* | 8/2014 | Leska | F16P 3/10 292/144 |
| 9,423,784 B2* | 8/2016 | Arth | G05B 9/03 |
| 2004/0199837 A1* | 10/2004 | Meyer-Grafe | G05B 9/03 714/712 |
| 2004/0246108 A1* | 12/2004 | Robertson | E21B 47/0007 340/854.3 |
| 2008/0042639 A1 | 2/2008 | Oster | |
| 2008/0082212 A1 | 4/2008 | Kato et al. | |
| 2009/0241014 A1* | 9/2009 | De Mareschal | G05B 9/03 714/824 |
| 2011/0291672 A1* | 12/2011 | Huttinger | G01R 31/27 324/649 |
| 2013/0264890 A1 | 10/2013 | Le et al. | |
| 2015/0168497 A1* | 6/2015 | Tabatowski-Bush | G01R 31/362 324/426 |

FOREIGN PATENT DOCUMENTS

| | | |
|---|---|---|
| CN | 1894638 A | 1/2007 |
| CN | 101030073 A | 9/2007 |
| CN | 101059684 A | 10/2007 |
| CN | 101180698 A | 5/2008 |
| CN | 101228486 A | 7/2008 |
| DE | 195 10 333 C1 | 10/1996 |
| DE | 199 06 932 A1 | 8/2000 |
| DE | 10 2006 030 114 A1 | 1/2008 |
| DE | 10 2010 054 386 B3 | 2/2012 |
| DE | 10 2011 015 498 A1 | 10/2012 |
| EP | 1 785 791 A1 | 5/2007 |
| EP | 1 873 915 A2 | 1/2008 |
| EP | 2 506 436 A2 | 10/2012 |

OTHER PUBLICATIONS

International Search Report for PCT/EP2014/063036; dated Oct. 6, 2014; 2 pp.

* cited by examiner

SAFETY SWITCHING DEVICE WITH FAILSAFE INPUTS

CROSS REFERENCES TO RELATED APPLICATIONS

This application is a continuation of international patent application PCT/EP2014/063036, filed on Jun. 20, 2014 designating the U.S., which international patent application has been published in German language as WO 2014/206885 A1 and claims priority from German patent application DE 10 2013 106 739.5, filed on Jun. 27, 2013. The entire contents of these priority applications are incorporated herein by reference.

BACKGROUND OF THE INVENTION

The present invention relates to a safety switching device for shutting down a technical installation in a failsafe manner and to a method for testing inputs of such a safety switching device.

In general, the invention relates to the field of machinery safety in terms of protecting persons and/or material valuables from dangers that are posed by technical installations or machines that function automatic manner, such as for example fully automated robots. In order to make installations of this type safe, different signaling devices, such as for example emergency OFF switches, position switches or electro-sensitive protective devices such as light barriers and light arrays can be used, with which it is possible to monitor access to an installation and to monitor that the installation is functioning in a safe manner. The signaling devices are coupled to a safety switching device that in dependence upon the signaling devices can transfer the technical installation into a safe non-critical state, in particular into a state in which the installation is shut down. It is therefore of great importance that the state transmitted by a signaling device is correctly identified by the safety switching device, in particular the OFF-state, in which the installation is to be shut down.

In order to enable a fail-safe shut down of the technical installation in the event of an incorrect input, the signaling devices are frequently coupled to the safety switching device in a two-channel, redundant manner by way of two inputs. The redundancy ensures that the installation is shut down even in the event of an error occurring in one of the channels. This procedure prevents the effects of a critical error but does not immediately identifies the critical error In other words the safe functioning of the installation is ensured but the error in one of the channels itself is not discovered. In order not only to prevent the effects of an error but also to identify the error, the inputs of the safety switching devices are equipped with self-test functions, with which said safety switching devices are able to test the detection capability of an individual input. Input circuits of this type are for instance known from DE 10 2006 030 114 B4 or from DE 10 2011 015 498 A1.

DE 10 2006 030 114 B4 discloses a prior art safety switching device with an input circuit for reading in input signals from a signaling device. The safety switching device comprises a signal input circuit and an evaluation circuit that can be switched on by a coupling member. The coupling member is connected to a reference voltage source to set a switching threshold that is to be exceeded by the input signal. Furthermore, the input circuit comprises a first testing circuit for testing the reference voltage source, and a second testing circuit with which a voltage can be injected into the signal input circuit in order to test the coupling member. The illustrated input circuit is however disadvantageous in that the testing circuits have in each case one or two coupling elements that are galvanically separated from one another in order to provide a galvanic separation between the signal input circuit and a subsequent logic unit initiating the tests. Coupling elements of this type are expensive in comparison to other components of the inputs and they require a large amount of installation space and they have a high failure rate.

DE 10 2011 015 498 A1 discloses a further prior art safety switching device. The safety switching device comprises an input circuit with a signal input circuit and an evaluating circuit that can be switched on by a coupling member. An additional transistor circuit is arranged before the coupling member so that a safe state can be detected either by the current of the input signal or by the voltage of the input signal. The switching threshold is set by a voltage reference. As is the case in DE 10 2006 030 114 B4, two testing circuits are provided. A first testing circuit tests the coupling member and the transistor, and the second testing circuit is used to test the reference voltage. The first and the second testing circuit comprise coupling elements for providing the galvanic separation between the signal input circuit and the logic unit that is connected subsequent thereof. In total, at least three coupling elements are required for the test devices. An advantage of the illustrated input circuit is that only one reference voltage source is required and thus only one testing circuit for said reference voltage source is needed. However, it is disadvantageous that all the parameters that are used to set the switching threshold are not fully checked by means of the second test circuit since the switching threshold in the illustrated circuit is not only dependent upon the voltage reference but also depends on the parameters of other components, in particular the parameters of the transistor circuit that is connected upstream thereof. It is thus desired to provide a safety switching device with enhanced testing capabilities in a cost-effective manner.

SUMMARY OF THE INVENTION

Against this background, it is an object of the present invention to provide an alternative safety switching device of the afore-mentioned type that offers improved testing capabilities for the inputs. It is another object to provide a safety switching device that is more cost-effective, and it is yet another object to provide a safety switching device that requires less installation space.

According to one aspect of the invention there is provided a safety switching device for shutting down a technical installation in a failsafe manner, comprising a first input channel for receiving a first input signal, a second input channel for receiving a second input signal, and a first testing arrangement for testing the first and second input channels; wherein the first input channel comprises a first entry circuit, a first threshold element, a first coupling element, a second testing arrangement, and a first transition circuit, wherein the second input channel comprises a second entry circuit, a second threshold element, a second coupling element, a third testing arrangement and a second transition circuit, wherein the first testing arrangement comprises a third coupling element, a ground terminal, and a group testing terminal, wherein the first entry circuit and the first threshold element are connected via the first coupling element with the second testing arrangement and the first transition circuit in a galvanically isolated manner, wherein the second entry circuit and the second threshold element are connected via the second coupling element with the third testing arrangement and the second transition circuit in a galvanically isolated manner, wherein the first threshold element, the second threshold element and the ground terminal are connected via the third coupling element to the group testing terminal in a galvanically isolated manner, and wherein the third coupling element is configured to connect the first threshold element and the second threshold element to the ground terminal.

According to a further aspect of the invention there is provided a method for reading in binary states in a failsafe manner, comprising the steps of receiving a first input signal using a first input channel, the first input channel comprising a first entry circuit, a first threshold element, a first coupling element, a second testing arrangement and a first transition circuit, receiving a second input signal using a second input channel, the second input channel comprising a second entry circuit, a second threshold element a second coupling element, a third testing arrangement and a second transition circuit, providing a first testing arrangement with a third coupling element, a ground terminal and a group testing terminal, connecting the first entry circuit and the first threshold element via the first coupling element with the second testing arrangement and the first transition circuit in a galvanically isolated manner, connecting the second entry circuit and the second threshold element via the second coupling element with the third testing arrangement and the second transition circuit in a galvanically isolated manner, connecting the first threshold element, the second threshold element and the ground terminal via the third coupling element to the group testing terminal in a galvanically isolated manner, and testing the first threshold element and the second threshold element by intermittently connecting the first threshold element and the second threshold element via the third coupling element to the ground terminal.

An idea of the invention is therefore to divide one input circuit into two separate regions that are galvanically separated from one another and that are connected only at defined, as few as possible sites by the first, second and third coupling elements. Each region comprises a separate testing arrangement, with which in a two-stage testing procedure on the one hand the detection capability of the input can be tested, and on the other an accumulation of errors in the subsequent redundant circuit parts can be detected.

The first circuit comprises for each input a separate signal input circuit and a separate threshold element. An input signal is received by the signal input circuit and transmitted via the first coupling element to the second circuit if the input signal exceeds the threshold value set by the threshold element. In other words, in the first circuit the input state detection takes place, wherein a first state is detected if the input signal exceeds the threshold value and a second state is detected if the input signal is below the threshold value.

The first circuit further comprises a first testing arrangement, by way of which the threshold elements of the input circuits can be activated and deactivated in order to initiate a state change intentionally. By evaluating this state change it can be concluded whether the threshold detection functions correctly. Moreover, since the first circuit is advantageously composed of discrete, individual components such that short-circuits between the components can be ruled out, it is possible by means of the first testing arrangement to detect all anticipated individual errors in the first circuit. In particular, it is ensured that the OFF state is correctly detected, which is the state that indicates that the installation is in an unsafe or unknown state.

It is particularly advantageous that the first testing arrangement can simultaneously test the detection capability of multiple inputs so that in total only one third coupling element is required for all the inputs. This reduces on the one hand the amount of installation space required and on the other hand the number of coupling elements required is advantageously reduced.

The second circuit forms the transition to a circuit part arranged subsequent to the input and in which the further signal processing is performed. The subsequent circuit part, preferably a logic unit with a microcontroller, is composed from integrated components so that short-circuits between signals can not be ruled out. To prevent errors as a result of short-circuits in this circuit part signals are processed in these parts in a multiple channel redundant manner. By providing multiple channels it is possible to handle an error, yet it is not possible to determine for an individual channel whether said individual channel is error-free or not. Hence, in the event of an individual error safety is ensured but the error itself is not identified. This is achieved in an advantageous manner by the second testing arrangement. The second testing arrangement is arranged for this purpose in the second circuit and is configured to interrupt the signal flow in dependence of a test signal. Since the detection capability is already ensured by means of the first testing arrangement, it is possible by intentionally interrupting the signal flow with the second testing arrangement to identify an error in the multiple channel part, for instance a short-circuit between two inputs of the IC.

Advantageously, the second testing arrangement is arranged in the second circuit and is hence completely galvanically separated from an applied input signal. The galvanic separation advantageously protects the second circuit from transient over-voltages and common mode interference pulses that can occur at the inputs. Hence, in contrast to the first testing arrangement, the second testing arrangement can be connected directly to a logic unit for receiving a test signal and does not require any additional coupling element. Coupling elements, in particular opto-couplers are expensive and require in comparison to other components a great amount of installation space so that a reduction in the number of these components has an advantageous effect on the physical size of the input circuit and the production costs.

Overall, the number of the required components can be advantageously reduced by the new device and the two-stage testing procedure. Simultaneously, errors are better detected, in particular with respect to accumulations of errors in the subsequent circuit parts.

The aforementioned object is therefore completely achieved.

In a preferred embodiment the first threshold element and the second threshold element define a detection capability of the first and second input and the first testing arrangement is configured to test said detection capability.

This embodiment has the advantage that the detection capability is solely depending on the circuit parts of the first circuit and the testing of the detection capability includes all components involved in defining the detection capability.

In a further preferred embodiment, the second testing arrangement comprises a first switching element and the third testing arrangement comprises a second switching element, wherein the first switching element is arranged in a current path between the first coupling element and the first transition circuit, and the second switching element is arranged in a current path between the second coupling element and the second transition circuit.

In this embodiment the second and third testing arrangement are able to interrupt in dependence upon an individual test signal or separate test signals the current path between the secondary side of the coupling elements for detecting the threshold and the transition circuits. It is possible in this manner to test the subsequent two-channel signal processing unit for individual errors in a channel in a particularly simple manner.

In a further embodiment, the first and second signal input circuit comprise EMC components with at least one voltage limiting device, in particular a Zener diode.

By means of the voltage limiting device a voltage can be limited in the input circuit to a maximum value. Advantageously, the components following the voltage limiting device can be designed for a lower voltage.

In a further embodiment, the first and/or second signal input circuit comprises a current limiting device that limits a current flow into the first and/or second entry circuit.

The current limiting device, preferably a linear regulator, defines a maximum current that can flow into the inputs. By limiting the input currents a power loss at the inputs can be reduce. In particular, if multiple inputs are connected, the sum of the power loss can lead to a considerable, unnecessary amount of current being consumed and this is advantageously limited by means of this embodiment.

In a further embodiment, the first and second transition circuit splits the respective input signal into two channels for subsequent, two-channel redundant signal processing.

Since signals are processed in the circuit parts subsequent of the transition circuit preferably by means of integrated circuits, it can be expected that crosstalk errors may occur in these circuit parts. By two-channel signal processing errors in these circuit parts can be handled.

In a particularly preferred embodiment, the transition circuits comprise decoupling elements for each channel to suppress any negative feedback effects.

In this embodiment any error within one channel of the two-channel signal processing cannot adversely affect the respective other channel. Preferably separating resistors which can additionally be helical are arranged in series in each channel.

In a further particularly preferred embodiment, signals are subsequently processed in separate channels that are embodied differently to one another.

In this embodiment, the failsafe aspect in these circuit parts is advantageously further increased by the diversity of the individual channels in addition to the redundancy.

In a further embodiment, a subsequent, redundant circuit part is arranged subsequent of the first and the second transition circuit, wherein the first testing arrangement is configured to test a detection capability of the inputs, and the second and third testing arrangement are configured to identify an error in a redundant circuit part and thus to control an accumulation of errors in these parts.

In this embodiment, the first testing arrangement tests the inputs independently from the second and third testing arrangement according to different safety principles. The first testing arrangement tests the detection capability of the inputs for individual errors in the input circuit and the second and third testing arrangement identify errors in subsequent circuit parts that per se are not safety critical as a result of the built-in redundancy but could be safety critical in the event of an accumulation of errors.

In a further embodiment, the first and the second threshold element is designed in a redundant manner, in particular with two Zener diodes.

The redundant design of the threshold elements may advantageously compensate for any drifting in value of the threshold elements.

In a further embodiment, a logic unit with filter elements is arranged subsequent of the first and second transition circuit to filter slow interference signals.

A logic unit that is arranged subsequent of the inputs further processes the input signals. In particular slow interference signals are removed by filters that are implemented preferably in the form of software in the logic unit. Filters in the logic unit can be easily adapted to address different interference signals.

It goes without saying that the features that are mentioned above and the features that are yet to be mentioned below can be used not only in the respective mentioned combination but rather they can also be used in other combinations or as stand-alone features without departing from the scope of the present invention.

BRIEF DESCRIPTION OF THE DRAWINGS

Exemplary embodiments of the invention are illustrated in the drawing and are explained in detail in the description below. In the drawings.

DESCRIPTION OF PREFERRED EMBODIMENTS

Figure 1:
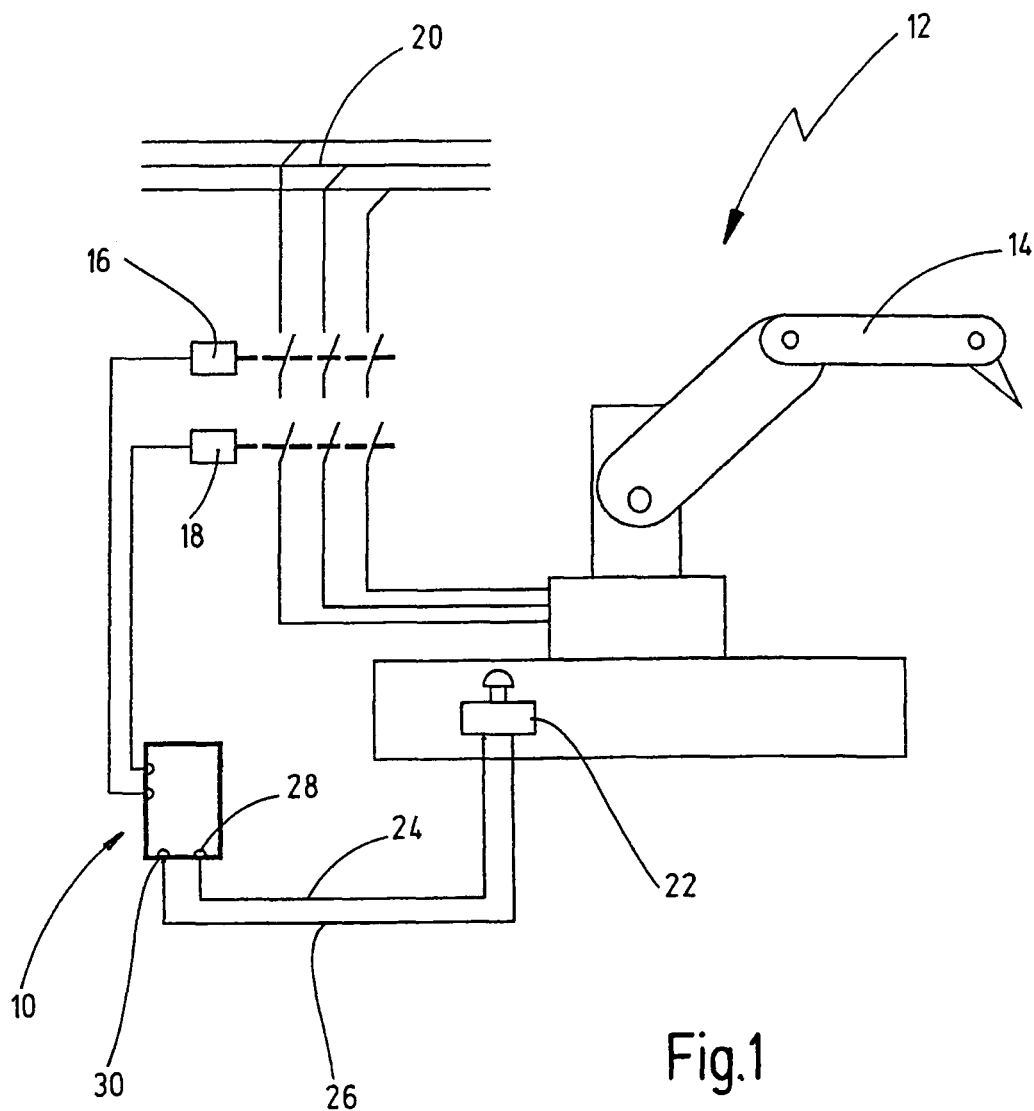
FIG. 1 illustrates a simplified illustration of an automated installation in which an exemplary embodiment of the new safety switching device is used.

In FIG. 1, an exemplary embodiment of the new safety switching device is denoted by the reference numeral 10. As an example the safety switching device 10 is used to safeguard an automated installation 12 which is indicated here by a robot 14. The engines of the robot 14 are connected to a power supply 20 in a known manner by two power contactors 16, 18. The working contacts of the two power contactors 16, 18 are arranged in series with respect to one another in the current path of the power supply to provide redundant shutdown means. The power contactors 16, 18 are controlled by the safety switching device 10 that only activates the contactors if the connected signaling devices indicate a safe state.

As signaling device 22 for this installation 12 a positively driven emergency OFF switch 22 is shown with break contacts that are connected by a first line 24 to an output 28 and by a second line 26 to an input 30 of the safety switching device 10. The safety switching device 10 applies a static potential to the output 28 which also applied to the input 30 by means of the positively driven emergency OFF switch 22 being in the non-activated state. If the emergency OFF switch 22 is activated, the break contact is physically opened so that the connection between the output 28 and the input 30 is interrupted. The absence of the static potential at the input 30 is being detected by the safety switching device 10 whereupon the power contactors 16, 18 are deactivated and the power supply to the engines of the robot 14 is interrupted. By cutting the power supply the robot 14 is transferred into a safe.

Instead of the emergency OFF switch 22 other signaling devices may be used, for instance position switches, protective door switches or electro-sensitive protective devices such as light barriers or light arrays. Likewise, the safety function does not necessarily have to be realized by interrupting the power supply. Under certain circumstances, it can be sufficient to shut down a machine in a controlled manner. However, it is a prerequisite of all variants that the absence of a signal that indicates the safe state, in other words the OFF state, is detected in a failsafe and reliable manner by the safety switching device 10. The inputs of the safety switching device 10 are therefore of great importance.

Figure 2:
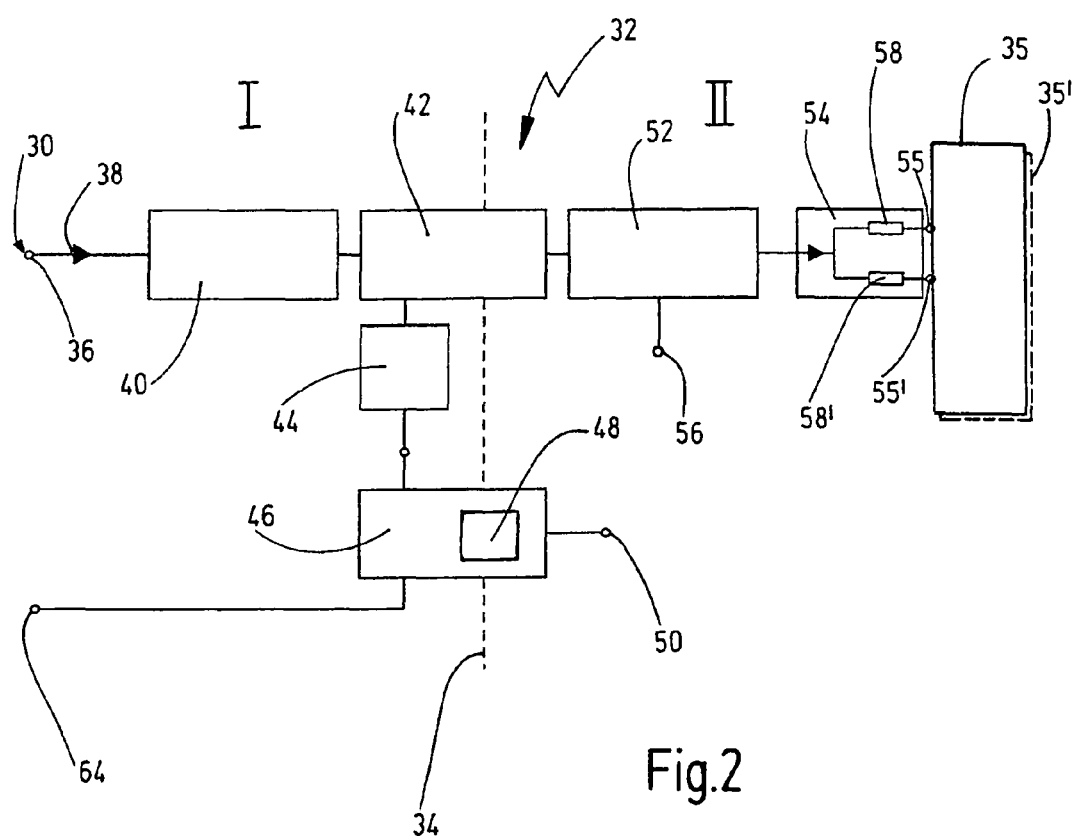
FIG. 2 illustrates a simplified schematic illustration of a new input circuit of a safety switching device.
Figure 3:
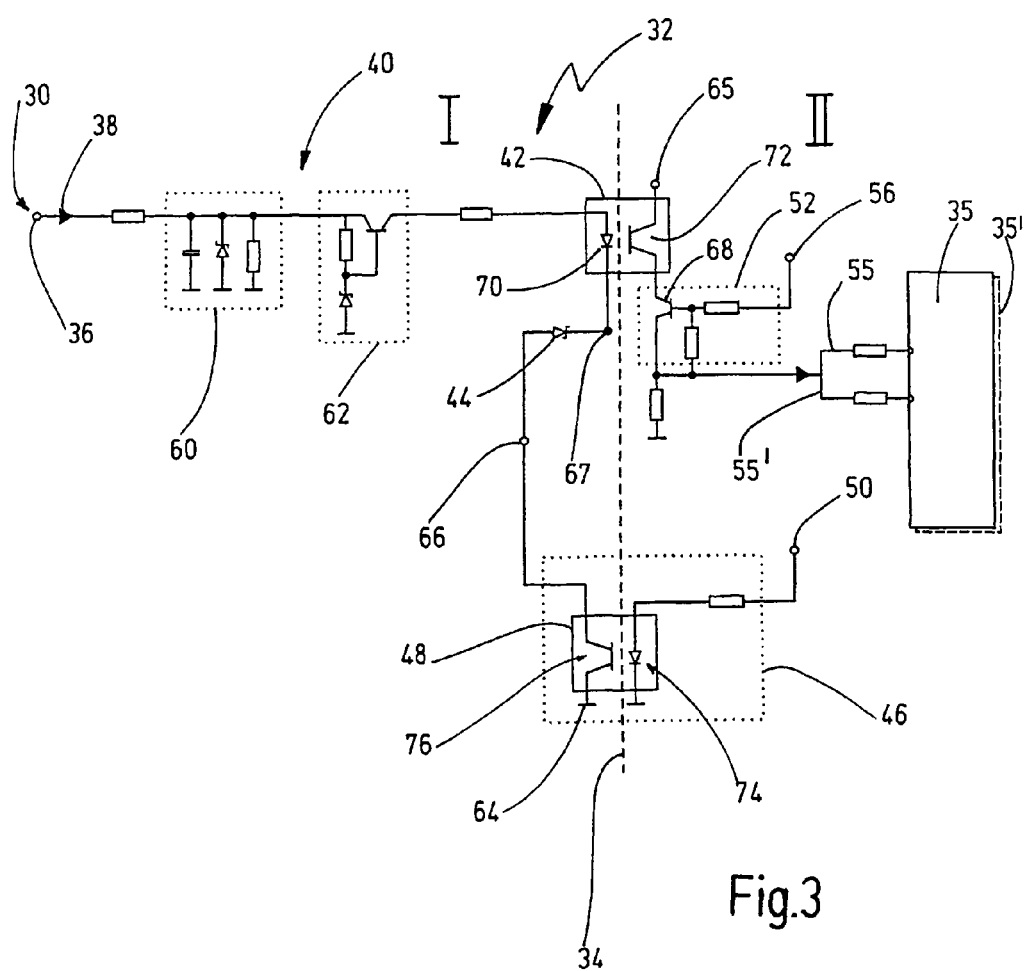
FIG. 3 illustrates one exemplary embodiment where a new input circuit is implemented.
Figure 4:
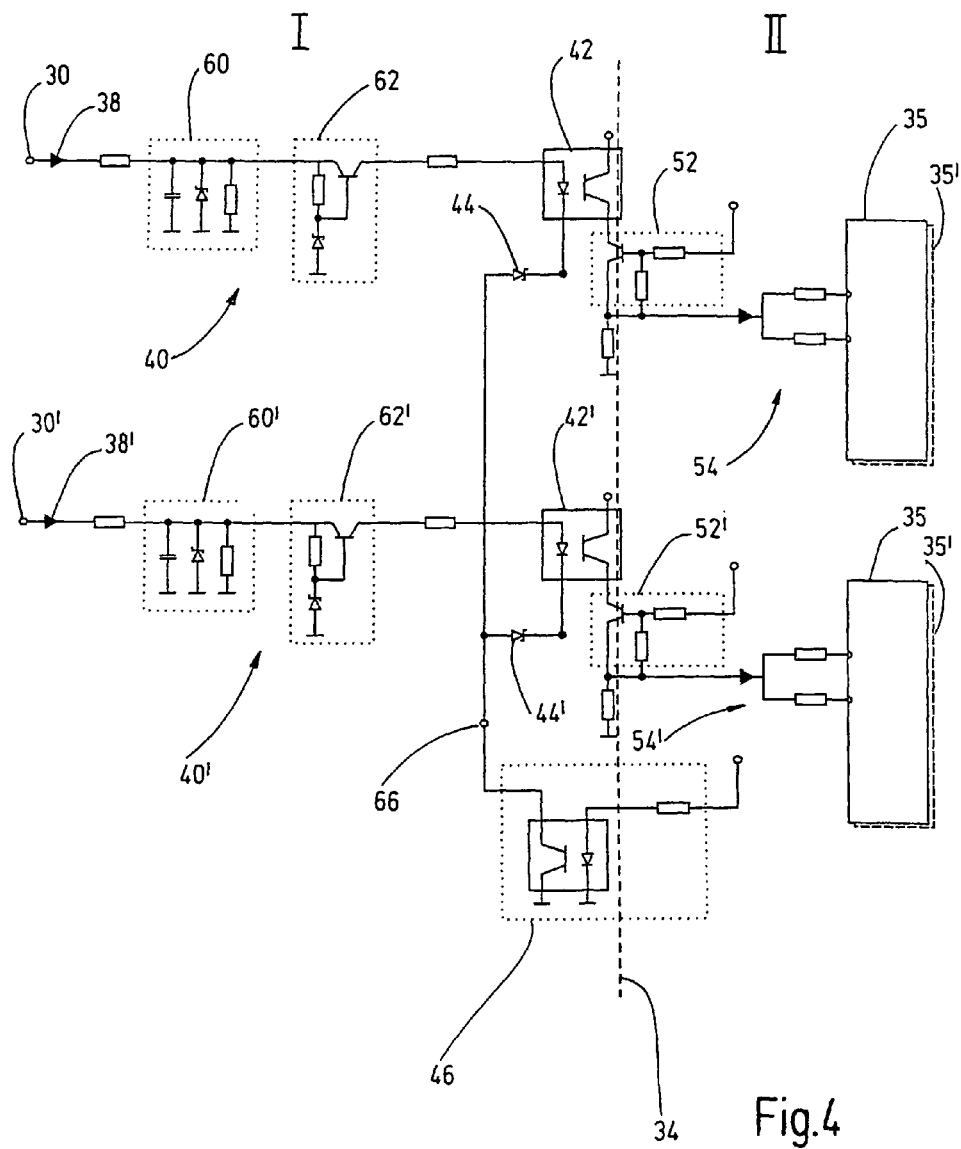
FIG. 4 illustrates a further exemplary embodiment where an input circuit that comprises two inputs is implemented.

With reference to FIG. 2 and FIG. 3, initially the operating mode of an individual new input 30 and of the associated input circuit 32 are explained in detail below. Subsequently, FIG. 4 illustrates the exemplary embodiment of FIG. 2 and FIG. 3 with an additional second input 30'.

FIG. 2 depicts a schematic illustration of an exemplary embodiment of a new input circuit 32. The functional units of the input circuit are depicted by function blocks.

The input circuit 32 is divided into a first (I) and a second circuit (II) that are completely galvanically separated from one another by coupling elements. The galvanic separation 34 is used to protect the subsequent components from being damaged as a result of over-voltages and the errors that result therefrom when detecting the OFF state. The galvanic separation 34 is indicated in the figures by a dashed line.

The first circuit (I) of the input 30 forms the primary side of the input circuit 32. On the primary side a peripheral terminal 36 is located via which an input signal 38 is received from a signaling device. The input signal 38 is preferably a binary signal with two defined states as can be provided for instance by two static potentials. The states are generally characterized by different voltage levels, wherein a first state is assumed if the voltage is below a defined threshold and a second state is assumed if a defined threshold is exceeded. The threshold is detected, as explained in detail below, with the aid of coupling elements 42 and a threshold element 44.

The input signal 38 is initially supplied to a signal input circuit 40 that suppresses electrical or electromagnetic interference effects. The signal input circuit 40 can comprise for instance one or multiple filter elements for ensuring electromagnetic compatibility, and for voltage limiting and/or current limiting. The input signal 38 that has been 'cleaned' of interference effects is subsequently supplied to the first coupling element 42. The coupling element 42 assumes two functions. On the one hand, the input signal 38 is transmitted to the second circuit (II) by way of the coupling element 42 and on the other hand a threshold detection procedure is performed with the aid of the subsequent threshold element 44. Only a signal whose voltage level exceeds a defined threshold value is transmitted to the second circuit (II). By means of the threshold detection procedure the input signal 38 is assigned at this point to either the first or the second logic state.

In order to perform the threshold detection procedure, the first circuit (I) comprises in addition to the first coupling element 42 a threshold element 44 which is in the most simplest case a voltage reference, for example in the form of a Zener diode. The threshold element 44 is further connected to a first testing arrangement 46, with which the threshold detection procedure can be tested. The first testing arrangement 46 is arranged in the first circuit (I) preferably between the threshold element 44 and a ground terminal 64 and is connected via an additional third coupling element 48 to the second circuit (II). Via the third coupling element 48 the first testing arrangement 46 can be operated by a control signal from the second circuit (II) side. Preferably, the first testing arrangement 46 is connected for this purpose to a subsequent logic unit 35 by a group testing terminal 50.

The first testing arrangement 46 is configured to deactivate the threshold element 44 in dependence upon a control signal of the logic unit 35, as a result of which the threshold changes so that an OFF state is indicated even in the presence of an input signal that is representing the safe state. If this intentional change of state is registered, it can be concluded that the coupling element 42 and the threshold element 44 are functioning correctly. Since short-circuits between the inputs can be ruled out as a result of the preferred discrete composition of the switching circuit (I) with the aid of discrete components that are fixedly wired to a printed circuit board, all anticipated individual errors that could pose a risk can be detected by means of the first testing arrangement 46 and handled for instance by transferring the installation 12 into a safe state. Preferably, the test is performed in relatively short intervals of less than 500 ms, for instance in time intervals of 200 ms. In a particularly preferred embodiment, the first testing arrangement 46 can simultaneously test multiple coupling elements and threshold elements.

The second circuit (II) further comprises a separate second testing arrangement 52 and a transition circuit 54. The second testing arrangement 52 is arranged in this case between the secondary side of the first coupling element 42 and the transition circuit 54. The second testing arrangement 52 can also be connected to the logic unit 35 by an individual testing terminal 56. The input signal 38 is transmitted to the transition circuit 54 by the first coupling element 42 if said input signal exceeds the set threshold. From the transition circuit 54 the input signal 38 is passed along to the subsequent logic unit 35 for further signal processing.

The logic unit 35 is preferably composed of integrated semi-conductor components, in particular microcontrollers, ASICs, FPGAs or other integrated logic components and said logic unit 35 is designed with two channels in order to ensure signal processing in a safe and reliable manner. Preferably, the two channels are further embodied differently from one another so that, in addition to the built-in redundancy, additional diversity is achieved as a result of the multi-channel design. Diversity and redundancy may be achieved inter alia by two, functionally identical microcontrollers that are produced by different manufacturers, as is indicated here by the additional microcontroller 35'. The transition circuit 54 splits the input signal into two channels 55, 55' irrespective of the subsequent arrangement and ensures with two decoupling elements 58, 58' per channel that one channel cannot have an adverse effect on the other channel. The decoupling elements 58, 58' may be implemented advantageously as series resistors.

The built-in redundancy and the diversity of the circuit parts that are arranged subsequent of the transition circuit 54 are sufficient to handle any individual errors that occur here, in other words errors within or at the input of the components of a channel, since the respective adjacent channel still correctly detects the signal. The term 'to handle" in this context means that in the event of an error occurring in one channel the process that is critical as far as the safety aspect is concerned can be controlled in a safe and reliable manner by using the signal of the other channel. The safety switching device 10 can thus perform its primary task and the installation still functions in a safe manner despite the individual error. The two-channel design per se does not allow allocating an error to a channel. Furthermore, the accumulation of multiple individual errors, when summed together, may lead to the installation no longer functioning in a safe manner (principle of error accumulation). The second testing arrangement 52 is therefore designed to identify individual errors in the two channel circuit part.

The second testing arrangement 52 preferably comprises a switching element in the current path between the secondary side of the first coupling element 42 and the transition circuit 54. In dependence upon a test signal at the individual testing terminal 56, the second testing arrangement 52 can interrupt the signal flow between the second coupling element 42 and the transition circuit 54. By intentionally interrupting the signal flow subsequent of the first coupling element 42 and after the threshold detection procedure, errors in the redundant signal flow can be detected by the second testing arrangement 52, since errors during the threshold detection procedure can be ruled out by means of the first testing arrangement 46.

As the second testing arrangement 52 is arranged in the second circuit II, no further coupling element is required since the second testing arrangement 52 is already completely galvanically separated from the input signal 38 that is applied to the input 30. The second testing arrangement 52 can thus be implemented in a particularly simple and cost-effective manner preferably by means of a simple switching element. Furthermore, the testing intervals for the individual tests can be designed to be much longer, for instance in seconds, in comparison to the test intervals of the first testing element 46, since the second testing arrangement 52 is used essentially only to detect an accumulation of errors and not for identifying errors that may lead directly to the loss of the safety function.

Overall, FIG. 2 depicts a favorable input circuit 32 with high fail-safety regarding the detection of OFF states. In particular, the number of coupling elements used can be reduced to a minimum since the testing of the safety function occurs in two stages and the second testing arrangement 52 does not require a coupling element.

With reference to FIG. 3 an advantageous implementation of the circuits depicted in FIG. 2 is further explained below. The same reference numbers denote the same parts.

The first circuit (I) and the second circuit (II) are galvanically separated from one another, as is indicated here by the dashed line 34. The galvanic separation line 34 extends through the first coupling element 42 and the third coupling element 48. A further connection between the two circuits (I, II) is not provided.

An input signal 38 is supplied via the peripheral terminal 36 and initially processed in a signal input circuit 40. The signal input circuit 40 comprises a first group of EMC components 60 and a second group that comprises components for forming a current limiter 62. The EMC components 60 comprise in this case capacitors, resistors and diodes to smooth the input signals 38 or to limit a defined input voltage. The current limiting device 62 comprises in this case a linear regulator that sets a maximum current flow into the input 30.

The signal input circuit 40 is followed by the first coupling element 42 which is an opto-coupler with a light emitting diode circuit 70 on the primary side and a collector-emitter circuit 72 on the secondary side. The primary side 70 and the secondary side 72 are galvanically separated from one another. The input signal 38 is transferred to the second circuit (II) by the first coupling element 42, wherein a defined threshold is set by the threshold element 44 that must be exceeded by the input signal 38 in order for said input signal to be transferred to the second circuit (II). The coupling element 42 and the threshold element 44 consequently "detect" the respective state of the input signal 38 and are consequently significantly responsible for the detection of the OFF state.

The threshold element 44 is here a simple voltage reference in the form of a Zener diode that is arranged directly at the output of the light emitting diode circuit 70 of the opto-coupler so that a defined voltage level (in addition to the diode voltage of the light emitting diode 70) is set as the threshold value at point 67. Only if an input signal 38 exceeds this voltage level does a current flow through the light emitting diode 70 of the opto-coupler and the collector-emitter path 72 of the opto-coupler becomes conductive.

The threshold element 44 is further connected via the first testing arrangement 46 to a ground terminal 64. Preferably, the ground terminal 64 is galvanically connected to a connecting terminal (not illustrated in this case) on the housing of the safety switching device 10 so that the ground potential is also available "externally". In preferred embodiments, the ground potential at the connection 64 is also the ground potential for the signaling device which supplies the input signal to the input 30. The first testing arrangement 46 comprises a further opto-coupler 48 and the primary side 74 of said further opto-coupler is arranged in the second circuit (II) and is connected to a group testing terminal 50 to receive a control signal. The collector-emitter path of the secondary side 76 is arranged in the current path between the threshold element 44 and the ground terminal 64. If a signal is supplied to the group testing terminal 50, the Zener diode, which is being used here as the threshold element 44, is connected to the ground at the connection 64 and a corresponding threshold is set at point 67. If, in contrast, the collector-emitter path 76 is interrupted so that current does not flow through the light emitting diode 70 in the opto-coupler of the first coupling element 42, the threshold element 44 is deactivated. Hence, by applying a control signal to the group testing terminal 50 the detection capability can be tested by the first coupling element 42 and the threshold element 44.

The reference numeral 66 denotes here a supply terminal, by which further threshold elements 44 of further inputs can be connected to the first testing arrangement 46. This way, as explained with reference to FIG. 4 in detail below, multiple inputs can be operated by a single first testing arrangement 46.

The further signal processing of the input signal takes place in the second circuit (II). The collector on the secondary side 72 of the opto-coupler 42 is connected for this purpose to a voltage supply unit 65 that corresponds to the internal supply voltage of the safety switching device 10, and the emitter is connected to a transition circuit 54 via a second testing arrangement 52. If a current is flowing through the primary side 70 of the opto-coupler 42, then a current is also flowing from the voltage supply unit 65 to the transition circuit 54. This way an input signal is transferred from the first circuit (I) to the second circuit (II). In the transition circuit 54 the signal is split into two channels 55, 55' to be subsequently further processed by a logic unit 35. Subsequent of the transition circuit 54, the input signal is therefore further processed in a two-channel redundant manner. In order to prevent one channel 55' from having a negative feedback effect on the other channel 55, decoupling elements 58, 58' are arranged in the transition circuit 54 in series in each channel. A two-channel processing can be achieved for instance by a second microcontroller 35'.

The second testing arrangement 52 is arranged between the coupling element 42 and the transition circuit 54. The second testing arrangement 52 comprises here a switching element 68 which is arranged in the current path between the secondary side 72 of the opto-coupler and the transition circuit 54. The switching element 68 can be operated by a control signal at the individual testing terminal 56 so that the current path can be closed or opened as desired. In a preferred exemplary embodiment, the logic unit 35 generates the control signal at the individual testing terminal 56. With the aid of the second testing arrangement 52 errors in the two-channel signal processing following the transition circuit 54 are identified by interrupting the current path of the input signal in an asynchronous manner with respect to the first testing arrangement 46. Preferably, the second testing arrangement 52 is operated in longer time intervals in comparison to the first testing arrangement 46 since the second testing arrangement 52 is used above all only to identify error accumulation and hence no testing is performed by the second testing arrangement 52 to detect errors that may lead directly to a loss of the safety function. In a preferred embodiment, the test cycle is much greater than 200 ms, as a consequence of which less load is placed on the logic unit 35, 35'.

With reference to FIG. 4, it is further explained how the detection capability of multiple inputs can be tested with the aid of the first testing element 46 simultaneously or in a common test cycle. FIG. 4 illustrates in this regard the exemplary embodiment illustrated in FIG. 3 with a further input 30' for receiving a further input signal 38'.

The second input 30' comprises its own dedicated signal input circuit 40' with EMC components 60' and with a current limiting device 62'. The second input 30' is further connected via a second coupling element 42', as previously described, to a transition circuit 54'. The input signal 38' is split into two channels at the transition circuit 54' and subsequently further processed in a redundant manner. A second testing arrangement 52' is arranged between the second coupling element 42' and the second transition circuit 54' by way of which redundant circuit parts 35, 35' can be tested in the manner previously described.

The second coupling element 42' comprises a second threshold element 44'. The threshold elements 44, 44' of the first and the second input 30, 30' are connected by a common connection 66 to the first testing arrangement 46, wherein the first testing arrangement 46 is configured to activate and deactivate the first threshold element 44 and also the second threshold element 44'.

Consequently, only one testing arrangement 46 is required for testing the detection capability of the first and the second input 30, 30', as a consequence of which in particular the number of coupling elements required at the inputs 30, 30' can be reduced.

Figure 5:
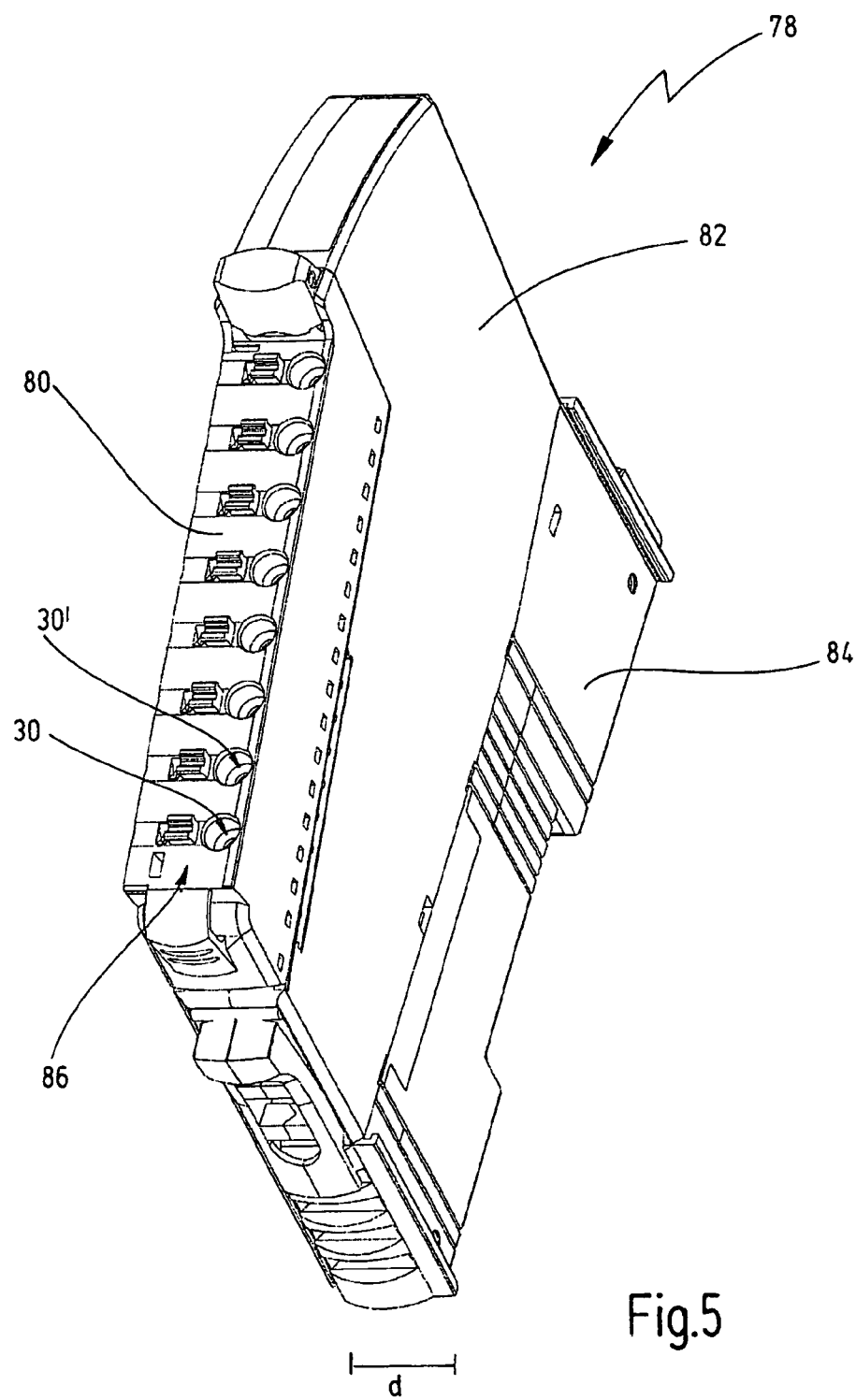
FIG. 5 illustrates a perspective illustration of an input module of the new safety switching device.

FIG. 5 illustrates with reference to a preferred exemplary embodiment how the new inputs can be combined in one input module 78 of the safety switching device 10.

The input module 78 comprises three module parts 80, 82, 84 that can be coupled to one another. The first module part 80 is a connection module part with connecting terminals 86 for receiving the input signals 38, 38'. The second module part 82 is a logic module, in which the signals are processed, and the third module part 84 is a so-called backplane module, by way of which the input module 78 can be connected to adjacent input modules and/or other components of the safety switching device.

The first module part 80 comprises a terminal strip with a total of eight connecting terminals 86 for receiving eight different input signals. The first module part 80 does not comprise any further electronic components. The module part 80 is merely used to receive external input signals and is preferably coupled by way of a plug connection to the logic module part 82 in which the signal processing takes place. By separating the connection module part and the logic module part in particular pre-configured cable harnesses can be connect to the input module 78 so that coupling of the safety switching device 10 with the signaling device 22 or the actuators 16, 18 can be achieved in a particularly simple manner.

The logic module part 82 comprises the previously described input circuits 32 that evaluate the input signals received at the connecting terminals of the first module part 80. The advantageous, in particular space-saving composition of the input circuits 32 allows for a particularly narrow construction of the input module 78 with respect to the module width d. Moreover, the logic unit 35 is arranged in the logic module 82 which in dependence upon the input signals generates one or multiple output signals in order to control the technical installation 12.

The output signals are preferably supplied by a separate output module (not illustrated here) to the respective actuators 16, 18, for instance to a power contactor in the power supply 20 of a technical installation 12. The transmission of signals from an input module to an output module is here handled by the third module part 84. The third module part 84 forms together with further third module parts that are arranged in series a so-called backplane. Each third module part 84 comprises for this purpose a bus element that is connected to the bus element of the previous and following third module part to form a bus structure between the third module parts to transmit a data bus. The logic modules are plugged onto the third module parts and are coupled to the data bus so that the individual logic module parts can communicate with one another over the data bus.

An output signal can be transmitted in this manner from an input module to an output module. Alternatively, the outputs may also be arranged directly on the logic module. By way of special communication modules it is furthermore possible to transmit the output signals to other safety switching devices to further process said signals. This is in particular advantageous for controlling large automated installations that comprise a plurality of individual installations.

In particular for such large automated installations, it is expedient to provide as small as possible modules for the safety switching device. The lean embodiment of the input circuit disclosed herein contributes to this in an advantageous manner.

What is claimed is:

1. A safety switching device for shutting down a technical installation in a failsafe manner comprising:
   a first input channel for receiving a first input signal,
   a second input channel for receiving a second input signal, and
   a first testing arrangement for testing the first and second input channels;
   wherein the first input channel comprises a first entry circuit, a first threshold element, a first coupling element, a second testing arrangement and a first transition circuit,
   wherein the second input channel comprises a second entry circuit, a second threshold element, a second coupling element, a third testing arrangement and a second transition circuit, wherein the first testing arrangement comprises a third coupling element, a ground terminal, and a group testing terminal, wherein the first entry circuit and the first threshold element are connected via the first coupling element with the second testing arrangement and the first transition circuit in a galvanically isolated manner, wherein the second entry circuit and the second threshold element are connected via the second coupling element with the third testing arrangement and the second transition circuit in a galvanically isolated manner, wherein the first threshold element, the second threshold element and the ground terminal are connected via the third coupling element to the group testing terminal in a galvanically isolated manner, and wherein the third coupling element is configured to connect the first threshold element and the second threshold element to the ground terminal.

2. The device of claim 1, wherein the first threshold element and the second threshold element define a detection capability of the first and second input, and the first testing arrangement is configured to test said detection capability.

3. The device of claim 1, wherein the second testing arrangement comprises a first switching element and the third testing arrangement comprises a second switching element, wherein the first switching element is arranged in a current path between the first coupling element and the first transition circuit, and the second switching element is arranged in a current path between the second coupling element and the second transition circuit.

4. The device of claim 1, wherein the first signal entry circuit and the second signal entry circuit comprise EMC components with at least one voltage limiting device.

5. The device of claim 4, wherein the at least one voltage limiting device is a Zener diode.

6. The device of claim 1, wherein the first signal entry circuit and the second signal entry circuit comprise current limiter components for limiting the current flow into the first signal entry circuit and the second signal entry circuit.

7. The device of claim 1, wherein the first transition circuit and the second transition circuit are configured to split the respective first input signal and second input signal into two channels for a subsequent two-channel redundant signal processing.

8. The device of claim 7, wherein the first transition circuit and the second transition circuit further comprise decoupling elements for the two channels to suppress negative feedback effects.

9. The device of claim 8, wherein the two channels of the subsequent signal processing are embodied differently.

10. The device of claim 1, wherein the first testing arrangement is configured to function in an asynchronous manner with respect to the second and third testing arrangement.

11. The device of claim 1, further comprising a first redundant circuitry part and a second redundant circuitry part, wherein the first transition circuit is operationally connected to the first redundant circuitry part and the second transition circuit is operationally connected to the second redundant circuitry part.

12. The device of claim 11, wherein the second and third testing arrangement are configured to identify errors in the first and second redundant circuitry parts to handle error accumulation.

13. The device of claim 1, wherein the first threshold element and the second threshold element are designed in a redundant manner.

14. The device of claim 1, wherein the first threshold element and the second threshold element comprise each a Zener diode.

15. The device of claim 1, further comprising a logic unit with filter elements, wherein the logic unit is arranged subsequent to the first transition circuit and the second transition circuit to filter slow interference signals.

16. A method for reading in binary states in a failsafe manner comprising the following steps:

receiving a first input signal using a first input channel, the first input channel comprising a first entry circuit, a first threshold element, a first coupling element, a second testing arrangement and a first transition circuit, receiving a second input signal using a second input channel, the second input channel comprising a second entry circuit, a second threshold element a second coupling element, a third testing arrangement and a second transition circuit, providing a first testing arrangement with a third coupling element, a ground terminal and a group testing terminal, connecting the first entry circuit and the first threshold element via the first coupling element with the second testing arrangement and the first transition circuit in a galvanically isolated manner, connecting the second entry circuit and the second threshold element via the second coupling element with the third testing arrangement and the second transition circuit in a galvanically isolated manner, connecting the first threshold element, the second threshold element and the ground terminal via the third coupling element with the group testing terminal in a galvanically isolated manner, and testing the first threshold element and the second threshold element by intermittently connecting the first threshold element and the second threshold element via the third coupling element to the ground terminal.

17. The method of claim 16, comprising the further step:

providing a first test signal to the group testing terminal to initiate the testing of the first threshold element and the second threshold element.

18. The method of claim 16, comprising the further steps of:

providing a first redundant circuitry part with a first signal processing channel and a second processing channel, providing an individual testing terminal connected to the second testing arrangement, connecting the first redundant circuitry part with the first transition circuit, providing a second test signal to the individual testing terminal to initiate testing of the first redundant circuitry part, and identifying an error in the first signal processing channel or the second processing channel of the first redundant circuitry part by intermittently interrupting a current flow between the first coupling element and the first transition circuit using the second testing arrangement.

* * * * *